(12) United States Patent
Vannorsdel

(10) Patent No.: US 6,236,233 B1
(45) Date of Patent: May 22, 2001

(54) METHOD AND SYSTEM FOR TRANSLATING TTL OFF-CHIP DRIVE FOR INTEGRATED CIRCUIT WITH NEGATIVE SUBSTRATE BIAS

(75) Inventor: Kevin Roy Vannorsdel, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/288,937

(22) Filed: Apr. 9, 1999

(51) Int. Cl.[7] .............................................. H03K 19/0175
(52) U.S. Cl. ................................................ 326/64; 326/90
(58) Field of Search ................................. 326/64, 65, 67, 326/70, 71, 74, 78, 82, 86, 89, 90

(56) References Cited

U.S. PATENT DOCUMENTS

| | | | |
|---|---|---|---|
| 4,677,320 | * 6/1987 | Hannington | 326/78 |
| 4,857,776 | * 8/1989 | Khan | 326/56 |
| 4,996,452 | * 2/1991 | Yee et al. | 326/78 |
| 5,120,999 | * 6/1992 | Schreck et al. | 326/27 |
| 5,138,199 | 8/1992 | Hirata et al. | 326/67 |
| 5,434,518 | * 7/1995 | Sinh et al. | 326/66 |
| 5,561,388 | 10/1996 | Kumagai | 326/66 |
| 6,051,995 | * 4/2000 | Pollachek | 326/87 |

* cited by examiner

Primary Examiner—Michael Tokar
Assistant Examiner—James A. Cho
(74) Attorney, Agent, or Firm—Sawyer Law Group LLP; Randall J. Bluestone

(57) ABSTRACT

The present invention provides a method and system for translating a signal from a chip with a negative substrate bias. The method and system includes receiving an input signal in a first state in a first logic level, the first state being approximately at ground; and translating the input signal to a second state in a second logic level, the second state being above ground. The method and system translates a signal from a chip with a negative substrate bias. In the preferred embodiment, the method and system of the present invention uses a translation circuit to translate and drive the signal off-chip. The translation circuit in accordance with the present invention functions with a positive Vcc and a Vee lower than ground, and also does not violate any of the rules of functionality for components used in a chip which has a negatively biased substrate and a voltage limit on its components. The method and system allows the translated signal to be driven off-chip and be compatible with standard TTL logic levels. A pre-amp chip which uses the translation circuit of the present invention is able to maintain a fast data rate and to take advantage of the low cost of the silicon process used for the chip.

23 Claims, 3 Drawing Sheets

METHOD AND SYSTEM FOR TRANSLATING TTL OFF-CHIP DRIVE FOR INTEGRATED CIRCUIT WITH NEGATIVE SUBSTRATE BIAS

FIELD OF THE INVENTION

The present invention relates to computer systems, and more particularly to disk drives in computer systems.

BACKGROUND OF THE INVENTION

Disk drives are well known components of computer systems. One type of disk drive which is commonly used in computer systems is a Direct Access Storage Device (DASD).

FIG. 1 is a block diagram illustrating a conventional system with a DASD. The system 100 comprises a host 102 which exchanges data via connection 104 with the DASD 106. The DASD 106 comprises Drive Electronics 108, Arm Electronics 110 (AE), and a Head and Disk Assembly 112. The AE 110 is generically referred to by many in the art as a "pre-amp chip".

FIG. 2 is a block diagram illustrating the AE 110 and the Head and Disk Assembly 112 in more detail. The Head and Disk Assembly 112 comprises a plurality of disks 114 for storing data, a Spindle Motor 116 which controls the speed at which each disk 114 spins, connections 117 between the AE 110 and the Head and Disk Assembly 112, and heads 118(a)–118(f). There is one pair of heads 118(a)–118(f) for each disk 114, one head for each surface of the disk. The heads 118(a)–118(f) read data from and write data to their respective disks. The heads 118(a)–118(f) are positioned over specific tracks on the disks 114 by a Head Positioning Motor 120. Both the Head Positioning Motor 120 and the Spindle Motor 116 are controlled by signals to and from a Positioning Control Unit 150. The AE 110 also communicates with the Drive Electronics 108.

There is a continuing demand in the industry for the data transfer rate from the disks 114 to the Drive Electronics 108 to be faster. One way to accomplish this is to use a BiCMOS4S chip, developed by INTERNATIONAL BUSINESS MACHINES CORPORATION, as the AE 110. The BiCMOS4S chip uses a silicon technology which allows for a fast data transfer rate. The BiCMOS4S silicon technology is well known in the art and will not be discussed in detail here.

However, the architecture of the BiCMOS4S chip negatively biases the substrate and imposes a voltage limit on its components. The chip is charged at a positive Vcc, for example of +5V, and a Vee below ground, for example of –4V. Vcc represents the voltage from a positive power supply; Vee represents the voltage from a negative power supply. The voltage limit on the chip components is Vcc–Vee. This creates a problem when a signal from the chip is to be driven off-chip to devices which use standard Transistor Transistor Logic (TTL) logic levels. Standard TTL-compatible devices are typically designed to function at a positive Vcc and ground. This problem is compounded by the fact that components used within the chip are also designed to function within a chip charged at a positive Vcc and ground.

Accordingly, there exists a need for a method and system for translating a signal from a chip with a negative substrate bias. The method and system should translate the signal such that it is compatible with standard TTL logic levels. The present invention addresses such a need.

SUMMARY OF THE INVENTION

The present invention provides a method and system for translating a signal from a chip with a negative substrate bias. The method and system includes receiving an input signal in a first state in a first logic level, the first state being approximately at ground; and translating the input signal to a second state in a second logic level, the second state being above ground. The method and system translates a signal from a chip with a negative substrate bias. In the preferred embodiment, the method and system of the present invention uses a translation circuit to translate and drive the signal off-chip. The translation circuit in accordance with the present invention functions with a positive Vcc and a Vee lower than ground, and also does not violate any of the rules of functionality for components used in a chip which has a negatively biased substrate and a voltage limit on its components. The method and system allows the translated signal to be driven off-chip and be compatible with standard TTL logic levels. A pre-amp chip which uses the translation circuit of the present invention is able to maintain a fast data rate and to take advantage of the low cost of the silicon process used for the chip.

DETAILED DESCRIPTION

The present invention provides a method and system for translating a signal from a chip with a negative substrate bias. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown but is to be accorded the widest scope consistent with the principles and features described herein.

To more particularly describe the features of the present invention, please refer to FIGS. 3 and 4 in conjunction with the discussion below.

The method and system of the present invention uses a translation circuit to translate and drive the signal off-chip. The translation circuit in accordance with the present invention must function with a positive Vcc and a Vee lower than ground, and also must not violate any of the rules of functionality for components used in a BiCMOS4S chip. These rules include:

Connecting the substrate of the chip to the most negative voltage present on the chip, i.e., Vee;

All Field Effect Transistor (FET) devices be used with terminal voltages not exceeding its voltage limitation, $V_{LIMIT}$, between any of its four terminals. In the preferred embodiment, $V_{LIMIT}$=+5V; and All internal logic functions be performed between Vee and ground.

These rules are well known by those in the art familiar with the BiCMOS4S silicon technology and will not be further discussed here.

Figure 1:
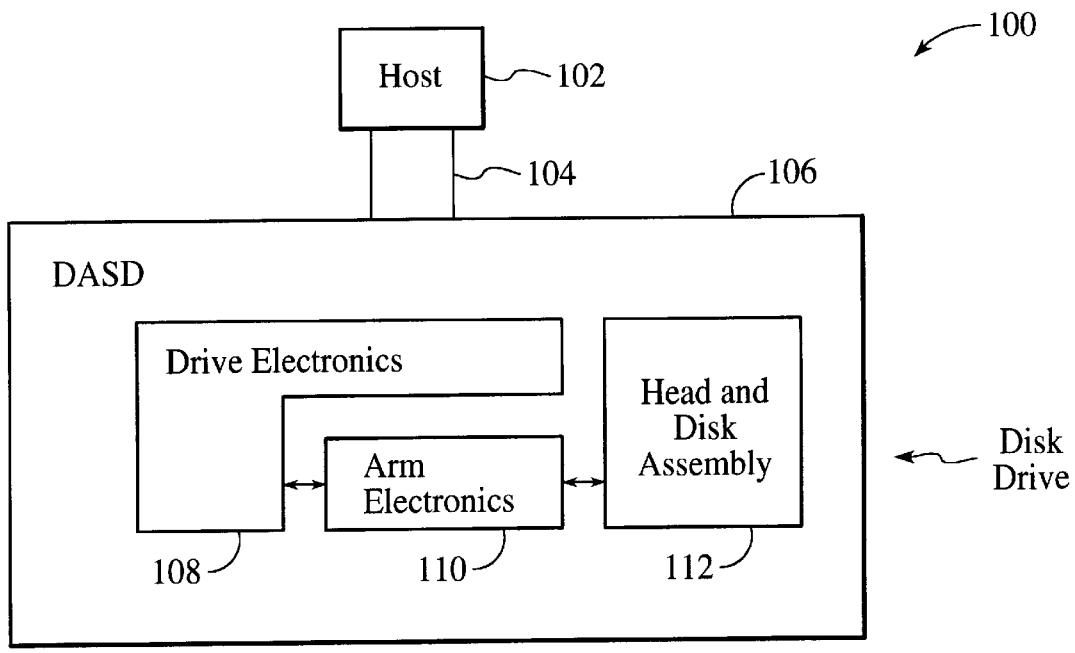
FIG. 1 is a block diagram illustrating a conventional system with a Direct Access Storage Device.
Figure 2:
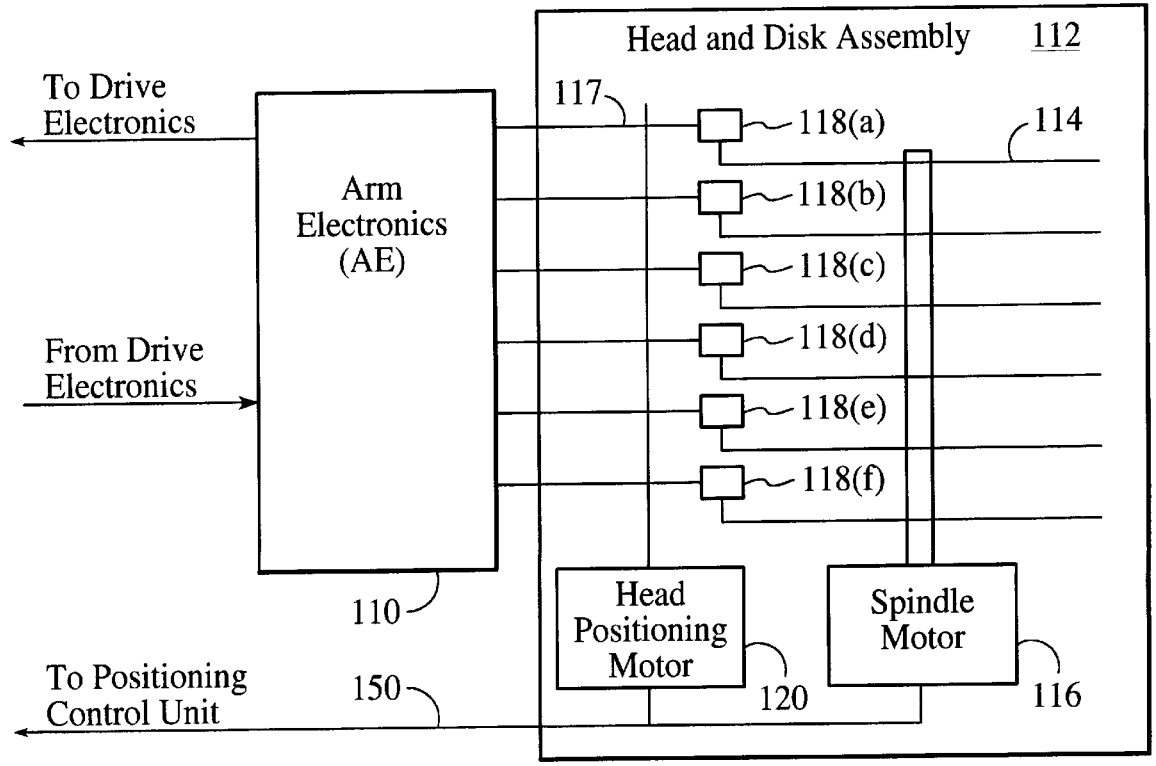
FIG. 2 is a block diagram illustrating in more detail the Arm Electronics and Head and Disk Assembly of the conventional system.
Figure 3:
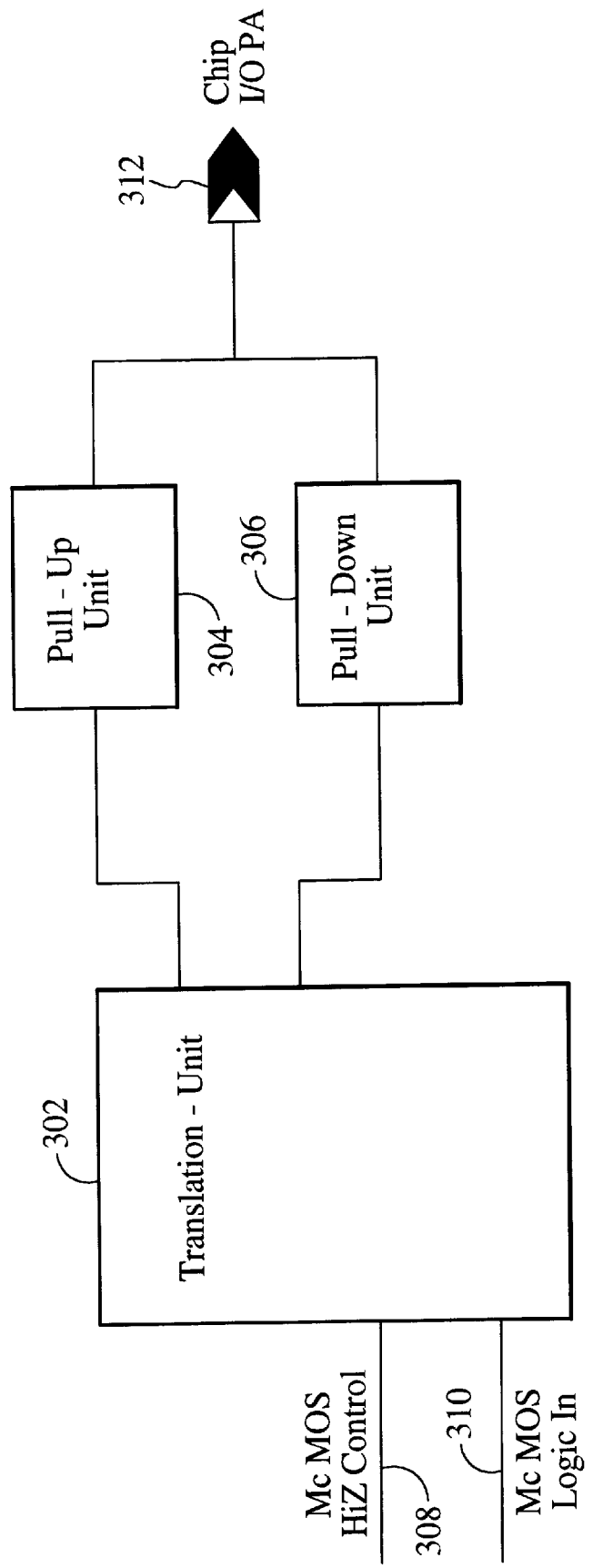
FIG. 3 is a block diagram of a preferred embodiment of a translation circuit in accordance with the present invention.

FIG. 3 is a block diagram illustrating a preferred embodiment of a translation circuit in accordance with the present invention which translates and drives a signal off chip without violating any of the rules above. The translation circuit 300 comprises a translation unit 302, a pull-up unit 304, and a pull-down unit 306. An input signal is applied via the input pin 310, and a translated output signal is provided at the output pin 312. In the preferred embodiment, the circuit 300 also comprises a T pin 308 to place the circuit 300 in a high impedance (HiZ) mode. The operation of the circuit 300 is described below.

On a BiCMOS4S chip, a high input signal is at ground while a low input signal is at Vee, such as −4V. The input signal is applied via input pin 310. It is translated by the translation unit 302 such that if the input signal is high, e.g., 0V, the pull-up unit 304 is activated while the pull-down unit 306 is not. The pull-up unit 304 "pulls up" the output voltage of the chip to a standard TTL-compatible logic high level, e.g., +5V. If the input signal is low, e.g., −4V, the pull-down unit 306 is activated while the pull-up unit 304 is not. The pull-down unit 306 "pulls down" the output voltage of the chip to a standard TTL-compatible logic low level, e.g., 0V.

The T pin 308 is used to completely shut off the translation circuit 300 by placing the circuit 300 in a high impedance mode. In the preferred embodiment, when a low voltage, e.g., −4V, is applied at the T pin 308, the circuit 300 functions as described above. When a high voltage, e.g., 0V, is applied, the circuit 300 is completely off such that it consumes no power. Because the consumption of power is always a concern in computer systems, it is advantageous to minimize the power consumed by the circuit 300.

Figure 4:
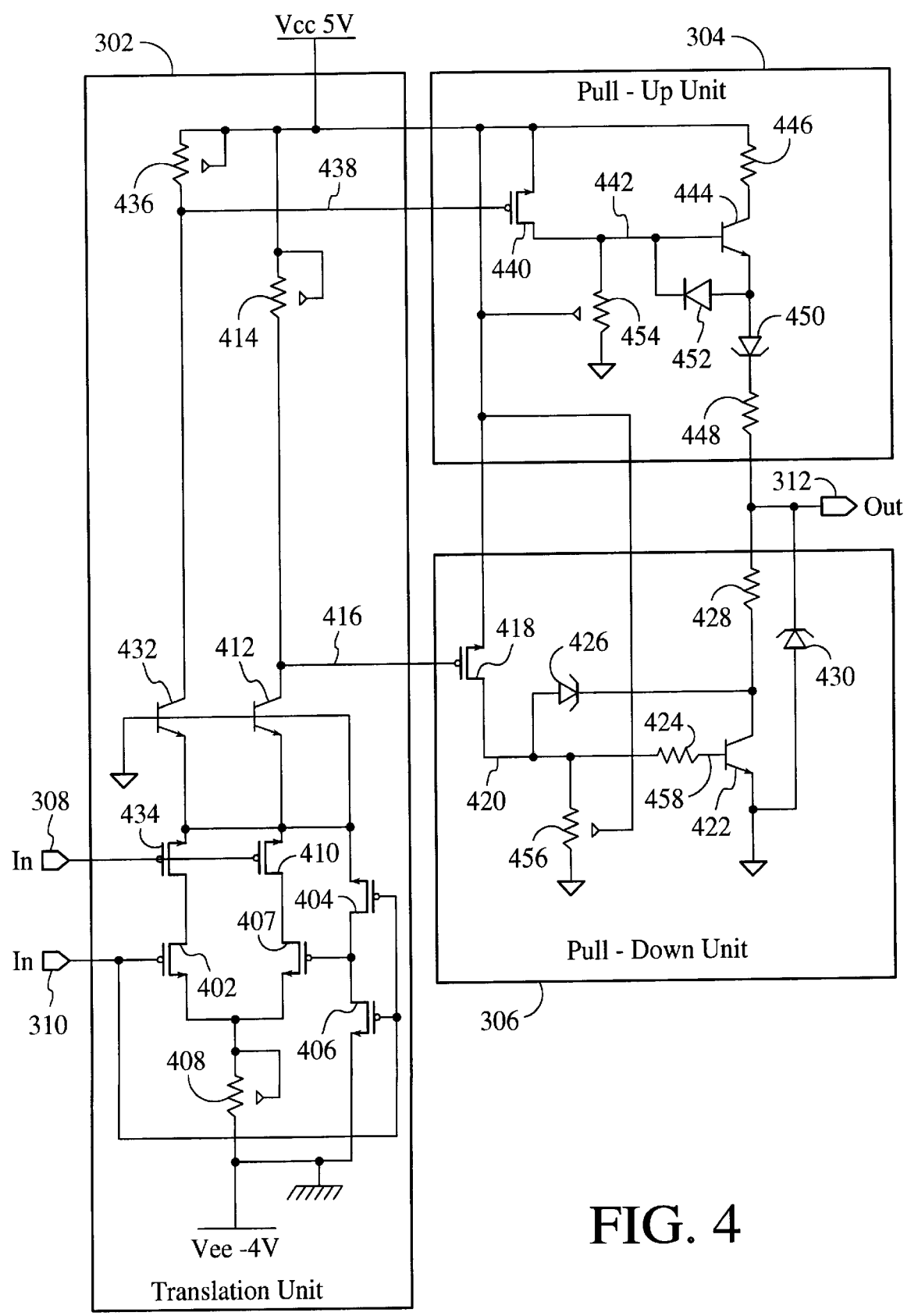
FIG. 4 is a circuit diagram illustrating in more detail the preferred embodiment of a translation circuit in accordance with the present invention.

FIG. 4 is a circuit diagram illustrating in more detail the preferred embodiment of the translation circuit in accordance with the present invention. For the purposes of this discussion, Vcc=5V and Vee=−4V.

Output Low

The output drives a TTL compatible logic low level when the input pin 310 and the T pin 308 are placed at Vee. The circuit operation for a low output state is discussed below.

The presence of the Vee voltage at the gate of NFET 402 will turn this NFET 402 off. The Vee is also inverted by PFET 404 and NFET 406 which applies 0V to the gate of NFET 407. This turns NFET 407 on and a path for current flow will be present through it and resistor 408. Since the signal at the T pin 308 is also Low (Vee), PFET 410 will be on and current will flow from the emitter of transistor 412 to Vee through the path previously recognized. This current flow will impose a voltage drop across resister 414. This voltage present at node 416 will tend to turn the PFET 418 on. Current will begin to flow into node 420, raising its voltage from ground. This will turn on the NPN transistor 422. Transistor 422 is protected from hard saturation by the resistor 424, Shotkey Diode 426 and the careful sizing of PFET 418. Some amount of current limiting and protection from voltage undershoot is provided by resistor 428 and Shotkey Diode 430. The problem of hard saturation, current limiting, and voltage undershoot are well known in the art and will not be further described here. Note that the Cascode NPN transistors 432 and 412 in the translation unit 302 act to protect the FET circuitry connected to emitters from voltages above ground.

Output High

The output drives a TTL compatible logic high level when the input pin 310 is placed at 0V and the HiZ pin 308 is placed at −4V. The circuit operation for a high output state is discussed below.

The presence of 0V at the gate of NFET 402 will turn this NFET 402 on. This voltage is also inverted by PFET 404 and NFET 406, applying Vee to the gate of NFET 407. This turns NFET 407 off. Since the T pin 308 is Low (Vee), PFET 434 will be on and current will flow from the emitter of transistor 432 to Vee through the path previously recognized. This current flow will impose a voltage drop across resistor 436. This voltage present at node 438 will tend to turn PFET 440 on. Current will begin to flow into node 442, raising its voltage from ground. This will turn on NPN transistor 444, raising the voltage at the output pin 312. Current limiting via device saturation is implemented by resistor 446. Resistor 448 helps to damp the output waveform in the presence of reactive loads. Shotkey Diode 450 and diode 452 are present to protect the Base-Emitter junction of transistor 444 from excessive reverse bias conditions that may be present when the driver is in HiZ mode.

HiZ

The output will be in a high impedance (HiZ) state whenever the T pin 308 is at 0V. In this state, the circuit 300 is completely off, consuming no power. The output is in a high impedance state allowing external circuitry to drive the line. The presence of 0V at the gates of PFETs 434 and 410 will shut these devices off, leaving no current path and thus no voltage drop across either resistor 436 or resistor 414. This will leave node 438 and node 416 at Vcc, shutting off PFET 440 in the pull-up unit 304 and PFET 418 in the pull-down unit. Resistor 454 in the pull-up unit 304 will then bring node 442 to ground, shutting off transistor 444. The resistor 456 in the pull-down unit 306 will bring node 458 to ground, also shutting off transistor 422. This leaves the output pin 312 with no voltage or current drive and in the HiZ state.

Diode 452 and Shotkey diode 450 in the pull-up unit 304 protect the base-emitter junction of transistor 444 from large reverse bias voltages if the output pin 312 is driven to a high level by external circuitry. Large reverse base-emitter voltages can cause NPN Beta degradation reducing circuit performance. The problems of reverse bias voltages and NPN Beta degradation is well known in the art and will not be described here.

Although the present invention has been described in the context of the voltages shown and for the translation to standard TTL-compatible logic levels, one of ordinary skill in the art will understand that other voltages may be used and translated to other logic levels without departing from the spirit and scope of the present invention.

Although the present invention has been described in the context of a disk drive, one of ordinary skill in the art will understand that the circuit of the present invention may be used in any context where a voltage translation is desired without departing from the spirit and scope of the present invention.

A method and system for translating a signal from a chip with a negative substrate bias has been disclosed. In the preferred embodiment, the method and system of the present invention uses a translation circuit to translate and drive the signal off-chip. The translation in accordance with the present invention functions with a positive Vcc and a Vee lower than ground, and also does not violate any of the rules of functionality for components used in a chip which has a negatively biased substrate and a voltage limit for the components. The method and system allows the translated signal to be driven off-chip and be compatible with standard TTL logic levels. A pre-amp chip which uses the translation circuit of the present invention is able to maintain a fast data rate and to take advantage of the low cost of the silicon process used for the chip.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A circuit comprising:
    a first power supply providing a voltage above ground;
    a second power supply providing a voltage below ground;
    a translation circuit coupled between the first and second power supplies for determining if a first state in a first logic level of an input signal is high or low;
    a pull-down circuit coupled to the translation circuit for translating the input signal to a low state in the second logic level if the first state is low;
    a pull-up circuit coupled to the translation circuit for translating the input signal to a high state in a second logic level if the first state is high;
    wherein the translation circuit comprises:
        a first circuit through which a current flows when the first state is low, comprising:
            a first transistor receiving an inverted input signal;
            a second transistor coupled in series to the first transistor;
            a first resistor coupled in series between the second transistor and the first power supply; and
            a second resistor coupled in series between the first transistor and the second power supply; and
        a second circuit through which a current flow when the first state is high, comprising:
            a third transistor receiving the input signal;
            a fourth transistor coupled in series to the third transistor;
            a third resistor coupled between the fourth transistor and the first power supply; and
            the second resistor coupled in series between the third transistor and the second power supply.

2. The circuit of claim 1, wherein the inverted input signal is inverted by an inverter circuit, comprising a fifth transistor and a sixth transistor, a common node of the fifth transistor and the sixth transistor coupled to a gate of the first transistor.

3. The circuit of claim 1, wherein the pull-down circuit comprises:
    a seventh transistor, a gate of the seventh transistor coupled to the translation circuit; and
    an eighth transistor, a gate of the eighth transistor coupled in series with the seventh transistor, an output signal of the eighth transistor being an output signal of the pull-down circuit.

4. The circuit in claim 3, further comprising:
    a fourth resistor coupled in series between the seventh transistor and the eighth transistor; and
    a first diode coupled in parallel with the combination of the eighth transistor and the fourth resistor, wherein the fourth resistor and the first diode protect the eighth transistor from a hard saturation.

5. The circuit in claim 3, further comprising:
    a fifth resistor coupled in series between the eighth transistor and the output of the pull-down circuit; and
    a second diode coupled in parallel with the combination of the eighth transistor and the fifth resistor, wherein the fifth resistor and the second diode protect the eighth transistor from voltage undershoot.

6. The circuit in claim 1, wherein the pull-up circuit comprises:
    a ninth transistor, a gate of the ninth transistor coupled to the translation circuit; and
    a tenth transistor, a gate of the tenth transistor coupled in series with the ninth transistor, an output signal of the tenth transistor being an output signal of the pull-up circuit.

7. The circuit in claim 6, further comprising:
    a sixth resistor coupled in series between the first power supply and the tenth transistor, the sixth resistor providing current limiting protection to the tenth transistor.

8. The circuit in claim 6, further comprising:
    a seventh resistor coupled in series between the tenth transistor and the output of the pull-up circuit, the seventh resistor damping the output signal waveform when in a presence of reactive loads.

9. The circuit in claim 1, further comprising a high impedance control circuit for activating a high impedance state if no translation is to be performed, comprising:
    an eleventh transistor coupled in series between the first transistor and the second transistor, the eleventh transistor receiving a high impedance control input signal; and
    a twelfth transistor coupled in series between the third transistor and the fourth transistor, the twelfth transistor receiving the high impedance control input signal, wherein the circuit consumes approximately no power when a high impedance control input signal is at a high state.

10. The circuit of claim 1, wherein:
    the high state of the first state is approximately zero volts;
    the low state of the first state is approximately −4V;
    the high state in the second level is approximately +5V; and
    the low state in the second level is approximately zero volts.

11. A circuit, comprising:
    a first power supply providing a voltage above ground;
    a second power supply providing a voltage below ground;
    a translation circuit coupled between the first and second power supplies for determining if a first state in a first logic level of an input signal is high or low, comprising:
        a first circuit through which a current flows when the first state is low, comprising:
            a first transistor receiving an inverted input signal;
            a second transistor coupled in series to the first transistor;
            a first resistor coupled in series between the second transistor and the first power supply; and
            a second resistor coupled in series between the third transistor and the second power supply; and
        a second circuit through which a current flow when the first state is high, comprising:
            a third transistor receiving the input signal;
            a fourth transistor coupled in series to the third transistor;

a third resistor coupled between the fourth transistor and the first power supply; and the second resistor coupled in series between the first transistor and the second power supply;

a pull-down circuit coupled to the translation circuit for translating the input signal to a low state in the second logic level if the first state is low, comprising:

a seventh transistor, a gate of the seventh transistor coupled to a common node of the first resistor and the second transistor; and an eighth transistor, a gate of the eighth transistor coupled in series with the seventh transistor, an output signal of the eighth transistor being an output signal of the pull-down circuit; and a pull-up circuit coupled to the translation circuit for translating the input signal to a high state in a second logic level if the first state is high, comprising:

a ninth transistor, a gate of the ninth transistor coupled to a common node of the fourth transistor and the third resistor; and a tenth transistor, a gate of the tenth transistor coupled in series with the ninth transistor, an output signal of the tenth transistor being an output signal of the pull-up circuit.

12. The circuit of claim 11, wherein the inverted input signal is inverted by an inverter circuit, comprising a fifth transistor and a sixth transistor, a common node of the fifth transistor and the sixth transistor coupled to a gate of the first transistor.

13. The circuit in claim 11, wherein the pull-down circuit further comprises:

a fourth resistor coupled in series between the seventh transistor and the eighth transistor; and a first diode coupled in parallel with the combination of the eighth transistor and the fourth resistor, wherein the fourth resistor and the first diode protect the eighth transistor from a hard saturation.

14. The circuit in claim 11, wherein the pull-down circuit further comprises:

a fifth resistor coupled in series between the eighth transistor and the output of the pull-down circuit; and a second diode coupled in parallel with the combination of the eighth transistor and the fifth resistor, wherein the fifth resistor and the second diode protect the eighth transistor from voltage undershoot.

15. The circuit in claim 11, wherein the pull-up circuit further comprises:

a sixth resistor coupled in series between the first power supply and the tenth transistor, the sixth resistor providing current limiting protection to the tenth transistor.

16. The circuit in claim 11, wherein the pull-up circuit further comprises:

a seventh resistor coupled in series between the tenth transistor and the output of the pull-up circuit, the seventh resistor damping the output signal waveform when in a presence of reactive loads.

17. The circuit in claim 11, further comprising a high impedance control circuit for activating a high impedance state if no translation is to be performed, comprising:

an eleventh transistor in the first circuit of the translation circuit, coupled in series between the first transistor and the second transistor, the eleventh transistor receiving a high impedance control input signal;

a twelfth transistor in the second circuit of the translation circuit, coupled in series between the third transistor and the fourth transistor, the twelfth transistor receiving the high impedance control input signal;

an eighth resistor in the pull-down circuit, coupled between ground and a common node of the fourth resistor and the fourth transistor; and a ninth resistor in the pull-up circuit, coupled between ground and a common node of the ninth transistor and the tenth transistor.

18. The circuit in claim 17, wherein the high impedance control circuit further comprises:

a third diode in the pull-up unit coupled in parallel with the tenth transistor; and a fourth diode in the pull-up unit coupled in series between the tenth transistor and the seventh resistor, wherein the third diode and the fourth diode protect a base-emitter junction of the tenth transistor from excessive bias conditions when the high impedance control input signal is at a high state.

19. The circuit of claim 11, wherein:

the high state of the first state is approximately zero volts;

the low state of the first state is approximately −4V;

the high state in the second level is approximately +5V; and the low state in the second level is approximately zero volts.

20. A circuit, comprising:

a first power supply providing a voltage above ground;

a second power supply providing a voltage below ground;

a translation circuit coupled between the first and second power supplies for determining if a first state in a first logic level of an input signal is high or low, comprising:

a first circuit through which a current flows when the first state is low, comprising:

a first transistor receiving an inverted input signal;

a second transistor coupled in series to the first transistor;

a first resistor coupled in series between the second transistor and the first power supply; and a second resistor coupled in series between the first transistor and the second power supply; and a second circuit through which a current flow when the first state is high, comprising:

a second transistor receiving the input signal;

a fourth transistor coupled in series to the third transistor;

a third resistor coupled between the fourth transistor and the first power supply; and the second resistor coupled in series between the third transistor and the second power supply;

a pull-down circuit coupled to the translation circuit for translating the input signal to a low state in the second logic level if the first state is low, comprising:

a seventh transistor, a gate of the seventh transistor coupled to a common node of the first resistor and the second transistor;

an eighth transistor, a gate of the eighth transistor coupled in series with the seventh transistor, an output signal of the eighth transistor being an output signal of the pull-down circuit;

a fourth resistor coupled in series between the seventh transistor and the eighth transistor; and a first diode coupled in parallel with the combination of the eighth transistor and the fourth resistor, wherein the fourth resistor and the first diode protects the eighth transistor from a hard saturation;

a fifth resistor coupled in series between the eighth transistor and the output of the pull-down circuit; and a second diode coupled in parallel with the combination of the eighth transistor and the fifth resistor, wherein the fifth resistor and the second diode protects the eighth transistor from voltage undershoot; and a pull-up circuit coupled to the translation circuit for translating the input signal to a high state in a second logic level if the first state is high, comprising:

a ninth transistor, a gate of the ninth transistor coupled to a common node of the fourth transistor and the third resistor;

a tenth transistor, a gate of the tenth transistor coupled in series with the ninth transistor, an output signal of the tenth transistor being an output signal of the pull-up circuit;

a sixth resistor coupled in series between the first power supply and the tenth transistor, the sixth resistor providing current limiting protection to the tenth transistor; and a seventh resistor coupled in series between the tenth transistor and the output of the pull-up circuit, the seventh resistor damping the output signal waveform when in a presence of reactive loads.

21. The circuit of claim 20, wherein the inverted input signal is inverted by an inverter circuit, comprising a fifth transistor and a sixth transistor, a common node of the fifth transistor and the sixth transistor coupled to a gate of the first transistor.

22. The circuit in claim 20, further comprising a high impedance control circuit for activating a high impedance state if no translation is to be performed, comprising:

an eleventh transistor in the first circuit of the translation circuit, coupled in series between the first transistor and the second transistor, the eleventh transistor receiving a high impedance control input signal;

a twelfth transistor in the second circuit of the translation circuit, coupled in series between the third transistor and the fourth transistor, the twelfth transistor receiving the high impedance control input signal;

an eighth resistor in the pull-down circuit, coupled between ground and a common node of the fourth resistor and the fourth transistor and ground;

a ninth resistor in the pull-up circuit, coupled between ground and a common node of the ninth transistor and the tenth transistor;

a third diode in the pull-up unit coupled in parallel with the tenth transistor; and a fourth diode in the pull-up unit coupled in series between the tenth transistor and the seventh resistor, wherein the third diode and the fourth diode protect a base-emitter junction of the tenth transistor from excessive bias conditions when the high impedance control input signal is at a high state.

23. The circuit of claim 20, wherein the high state of the input signal is approximately zero volts, the low state of the input signal is approximately −4V, the translated high state is approximately +5V, and the translated low state is approximately zero volts.

* * * * *